US011503431B2

(12) United States Patent
Bishop, Jr. et al.

(10) Patent No.: US 11,503,431 B2
(45) Date of Patent: Nov. 15, 2022

(54) SIMULATOR FOR NEARBY INTERACTIONS OF DEVICES

(71) Applicant: Apple Inc., Cupertino, CA (US)

(72) Inventors: Russell A. Bishop, Jr., San Francisco, CA (US); Jeremiah R. Sequoia, Woodside, CA (US); Jonathan R. Schoenberg, Fishers, IN (US); Yagil Burowski, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 203 days.

(21) Appl. No.: 17/030,713

(22) Filed: Sep. 24, 2020

(65) Prior Publication Data

US 2021/0400434 A1 Dec. 23, 2021

Related U.S. Application Data

(60) Provisional application No. 63/041,701, filed on Jun. 19, 2020.

(51) Int. Cl.
*G06F 30/20* (2020.01)
*H04W 4/02* (2018.01)

(52) U.S. Cl.
CPC ............ *H04W 4/026* (2013.01); *G06F 30/20* (2020.01)

(58) Field of Classification Search
CPC ............................... H04W 4/026; G06F 30/20

USPC ...................................................... 455/456.1
See application file for complete search history.

(56) References Cited

U.S. PATENT DOCUMENTS

| 9,439,039 | B1 * | 9/2016 | Patil | H04W 4/023 |
|---|---|---|---|---|
| 9,974,040 | B1 * | 5/2018 | Chu | H04L 41/12 |
| 2020/0366335 | A1 * | 11/2020 | Lee | H04W 88/06 |
| 2021/0211858 | A1 * | 7/2021 | Ellenbeck | H04W 72/0466 |

* cited by examiner

*Primary Examiner* — Thomas J Lett
(74) *Attorney, Agent, or Firm* — Kilpatrick Townsend & Stockton LLP

(57) ABSTRACT

A method includes receiving a first instance of code to be simulated for a first mobile device and a second instance of code to be simulated for a second mobile device, and generating, on a graphical user interface, a first representation of the first mobile device and a second representation of the second mobile device. When a request for a ranging measurement between the mobile device representations is received, a first pixel representative of a first location of the first representation and a second pixel representative of a second location of the second representation is determined, and a separation value between the first and second pixels is determined. A ranging value is determined based on the separation value and provided to the first instance of code in response to the request, thereby enabling the first instance of code to simulate a physical ranging measurement between two physical devices.

20 Claims, 11 Drawing Sheets

SIMULATOR FOR NEARBY INTERACTIONS OF DEVICES

CROSS-REFERENCES TO RELATED APPLICATIONS

This application claims priority to U.S. Provisional Application Ser. No. 63/041,701, filed Jun. 19, 2020, which is hereby incorporated by reference in its entirety for all purposes.

BACKGROUND

Mobile devices may contain applications designed to enable a user to interact with or communicate with other users and/or devices. To communicate with other devices, a mobile device may use wireless ranging techniques to detect that the other devices are in the vicinity. Range detection data may be provided by communication between two or more physical devices. An application developer may need to operate multiple mobile devices to generate ranging data to test an application designed for communication with other devices. Using multiple physical devices to develop applications can be inconvenient and cumbersome, and can result in inefficient application development.

BRIEF SUMMARY

Techniques are provided for simulating an application that uses ranging functionality, e.g., for determining a distance between two devices. Such techniques can help development of software that uses such ranging functionality, without having to perform physical tests in a real world environment, thereby saving time and expense.

For example, a simulator executing on a computer system can provide an interactive display that enables a user to change the relative position of graphical representations of devices while providing simulated ranging data (e.g., distance and direction) between the devices. The simulator can use the simulated ranging data to simulate changes of applications (instances of code) running on the devices that would occur in response to changing ranging data. For providing the ranging data, a virtual coordinate system can adjust for a physical layout of one or more computer display screens of the computer system, and the physical coordinates of the display screen are transformed into the virtual coordinate system to locate the graphical representations of the devices. Distance and direction measurements between the devices can be scaled to provide realistic physical distance and physical direction data in a physical coordinate system. The direction measurement may be a function of distance based on, for example, a stereographic projection of the relative positions. The simulator can be provided as part of an integrated development environment for developing spatial awareness applications for devices, and can allow a developer to determine the response of an application, for example, trigger events or interactions, based on physical distance and physical direction without using two physical devices.

These and other embodiments of the disclosure are described in detail below. For example, other embodiments are directed to systems, devices, and computer-readable media associated with methods described herein.

A better understanding of the nature and advantages of embodiments of the present disclosure may be gained with reference to the following detailed description and the accompanying drawings.

DETAILED DESCRIPTION

A mobile device can include ranging circuitry that determines the relative distance between the mobile device and another device. For example, time of flight measurements can be performed using ultra-wideband (UWB) pulses transmitted between the devices. The ranging circuitry can provide ranging data (e.g., distance and angle information), which can be used to determine a relative position of one device to another. As examples of a ranging value, the relative position can include a distance value, angular (orientation) value, or both, between the two devices.

In this manner, a user device may sense other devices nearby and may determine a most relevant nearby device based on where the user device is pointed or oriented. Applications may use such ranging data in a variety of ways. Aspects of the present disclosure can enable application developers to leverage capabilities of the simulator user interface (UI) to measure the distance and direction between simulated devices so as to test the use of ranging functionality by the application. For example, the simulation of distance and direction occurring within the simulator can enable the developer to determine how an application responds based on physical distance and physical direction in the simulator without having to use two physical devices to run the application or perform application development.

In this disclosure below, example ranging techniques are described, followed by a description of an example integrated developer environment. Example simulation of ranging functionality in an integrated developer environment is then described, as well as other embodiments of the present disclosure.

I. Ranging

A mobile device can include circuitry for performing ranging measurements. Such circuitry can include one or more dedicated antennas (e.g., 3) and circuitry for processing measured signals. The ranging measurements can be performed using the time-of-flight of pulses between the two mobile devices. In some implementations, a round-trip time (RTT) is used to determine distance information, e.g., for each of the antennas. In other implementations, a single-trip time in one direction can be used. The pulses may be formed using ultra-wideband (UWB) radio technology.

A. Sequence Diagram

Figure 1:
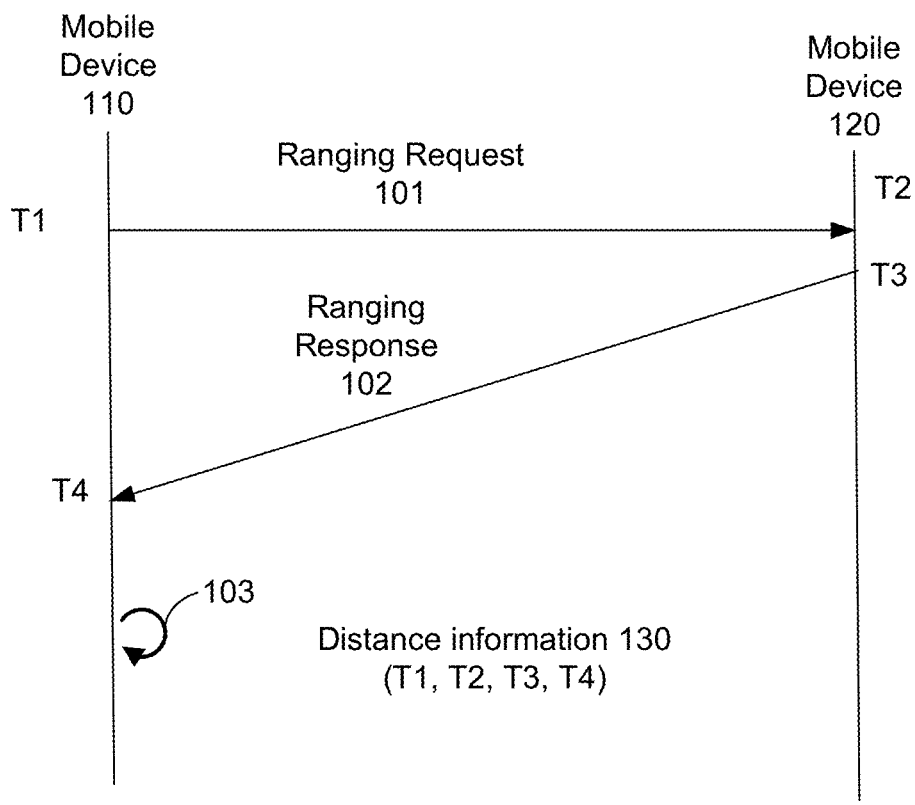
FIG. 1 shows a sequence diagram for performing a ranging measurement between two mobile devices according to aspects of the present disclosure.

FIG. 1 shows a sequence diagram for performing a ranging measurement between two mobile devices according to aspects of the present disclosure. The two mobile devices may belong to two different users. Although FIG. 1 shows a single measurement, the process can be repeated to perform multiple measurements over a time interval as part of a ranging session, where such measurements can be averaged or otherwise analyzed to provide a single distance value, e.g., for each antenna.

Mobile device 110 can initiate a ranging measurement by transmitting a ranging request 101 to a mobile device 120. The ranging measurement can be performed using a ranging wireless protocol (e.g., UWB). The ranging measurement may be triggered in various ways, e.g., based on user input and/or authentication using another wireless protocol, e.g., Bluetooth low energy (BLE).

At T1, mobile device 110 transmits ranging request 101. At T2, mobile device 120 receives ranging request 101. In response to receiving ranging request 101, mobile device 120 can transmit ranging response 102 at time T3. Ranging response 102 can include times T2 and T3 so that mobile device 110 can compute distance information. As an alternative, a delta between the two times (e.g., T3-T2) can be sent.

At T4, mobile device 110 can receive ranging response 102. At 103, mobile device 110 computes distance information 130.

B. Triangulation

In some embodiments, a mobile device can have multiple antennas, e.g., to perform triangulation. The separate measurements from different antennas can be used to determine a two-dimensional (2D) position, as opposed to a single distance value that could result from anywhere on a circle/sphere around the mobile device. The two-dimensional position can be specified in various coordinates, e.g., Cartesian or polar, where polar coordinates can comprise an angular value and a radial value.

Figure 2:
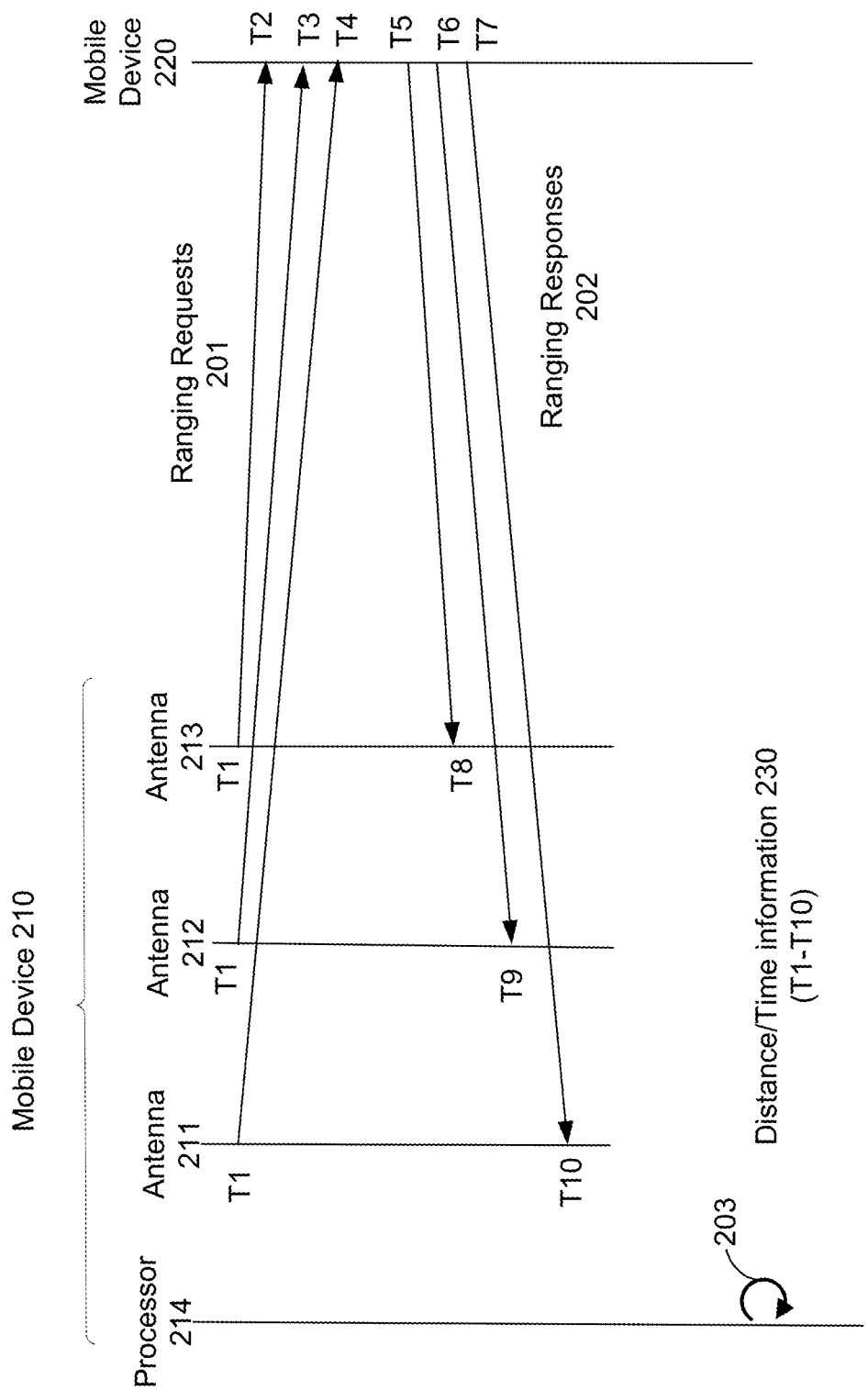
FIG. 2 shows a sequence diagram of a ranging operation involving a mobile device having three antennas according to aspects of the present disclosure.

FIG. 2 shows a sequence diagram of a ranging operation involving a mobile device 210 having three antennas 211-213 according to aspects of the present disclosure. Antennas 211-213 can be arranged to have different orientations, e.g., to define a field of view for performing ranging measurements.

In this example of FIG. 2, each of antennas 211-213 transmits a packet (including one or more pulses) that is received by mobile device 220. These packets can be part of ranging requests 201. The packets can each be transmitted at time T1 or they can be transmitted at different times. In some embodiments, mobile device 220 can also have multiple antennas.

As illustrated in FIG. 2, three packets of ranging requests 201 are received at times T2, T3, and T4, respectively. Mobile device 220 provides ranging responses 202, which are sent at times T5, T6, and T7, respectively. The values for T5, T6, and T7 may be the same. Mobile device 210 receives the ranging responses at times T8, T9, and T10, respectively.

At 203, processor 214 of mobile device 210 computes distance information 230.

Processor 214 can receive the times from the antennas, and more specifically from circuitry (e.g., UWB circuitry) that analyzes signals from antennas 211-213. Distance information 230 can be used to determine a 2D or 3D position of mobile device 220, where such position can be used to configure a display screen of mobile device 210. For instance, the position can be used to determine where to display an icon corresponding to mobile device 220, e.g., which position in a list, which position in a 2D grid, or in which cluster of 1D, 2D, or 3D distance/position ranges to display the icon.

II. Mobile Device for Performing Ranging

Figure 3:
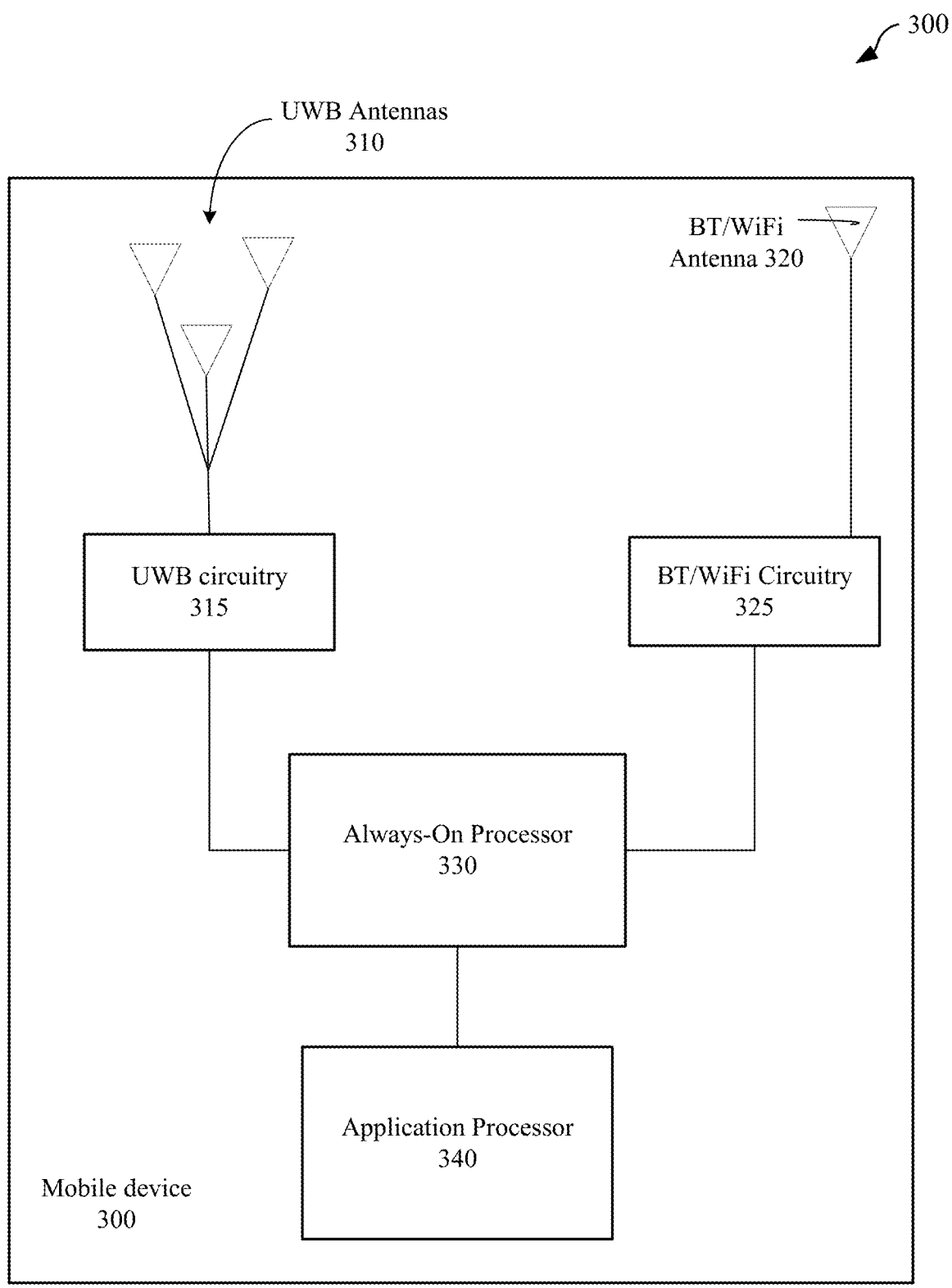
FIG. 3 is a block diagram of components of a mobile device operable to perform ranging according to aspects of the present disclosure.

FIG. 3 is a block diagram of components of a mobile device 300 operable to perform ranging according to aspects of the present disclosure. The mobile device 300 may include antennas for at least two different wireless protocols. The first wireless protocol (e.g., UWB) and the second wireless protocol (e.g., Bluetooth) may both be used for performing ranging with another mobile device.

As shown in FIG. 3, the mobile device 300 includes UWB antennas 310 for performing ranging. The UWB antennas 310 are connected to UWB circuitry 315 for analyzing detected signals from the UWB antennas 310. In some embodiments, the mobile device 300 includes three or more UWB antennas, e.g., for performing triangulation. The different UWB antennas can have different orientations, e.g., two in one direction and a third in another direction, which enable obtaining distance and angle information for target mobile devices. Triangulation can allow a determination of a direction to one or more other nearby target devices relative to direction a user is pointing the device. The orientations of the UWB antennas can define a field of view for ranging. As an example, the field of view can span approximately 120 degrees.

The UWB circuitry 315 can communicate with an always-on processor (AOP) 330, which can perform further processing using information from UWB messages. For example, AOP 330 can perform the ranging calculations using timing data provided by UWB circuitry 315. AOP 330 and other circuits of the device can include dedicated circuitry and/or configurable circuitry, e.g., via firmware or other software.

The mobile device 300 also includes BT/WiFi antenna 320. BT/WiFi antenna 320 is connected to BT/WiFi circuitry 325 for analyzing detected signals from BT/WiFi antenna 320. The BT/WiFi antenna 320 and BT/WiFi circuitry 325 may detect received signal strength indications (RSSI) from BT/WiFi antennas of other mobile devices in the vicinity, even from mobile devices that may be considered outside the field of view of the mobile device, for example, behind the user.

To perform ranging, BT/WiFi circuitry 325 can analyze an advertisement signal from another device to determine that the other device wants to perform ranging, e.g., as part of a process for sharing content. BT/WiFi circuitry 325 can communicate this notification to AOP 330, which can schedule UWB circuitry 315 to be ready to detect UWB messages from the other device. For the device initiating ranging, its AOP can perform the ranging calculations. Further, the AOP can monitor changes in distance between the other device. For example, AOP 330 can compare the distance to a threshold value and provide an alert when the distance exceeds a threshold, or potentially provide a reminder when the two devices become sufficiently close.

In some embodiments, UWB circuitry 315 and BT/WiFi circuitry 325 can alternatively or in addition be connected to application processor 340, which can perform similar functionality as AOP 330. Application processor 340 typically requires more power than AOP 330, and thus power can be saved by AOP 330 handling certain functionality, so that application processor 340 can remain in a sleep state, e.g., an off state. As an example, application processor 340 can be used for communicating audio or video using BT/WiFi, while AOP 330 can coordinate transmission of such content and communication between UWB circuitry 315 and BT/WiFi circuitry 325. For instance, AOP 330 can coordinate timing of UWB messages relative to BT.

III. Integrated Development Environment

A computer system may store and run an integrated development environment (IDE).

Figure 4:
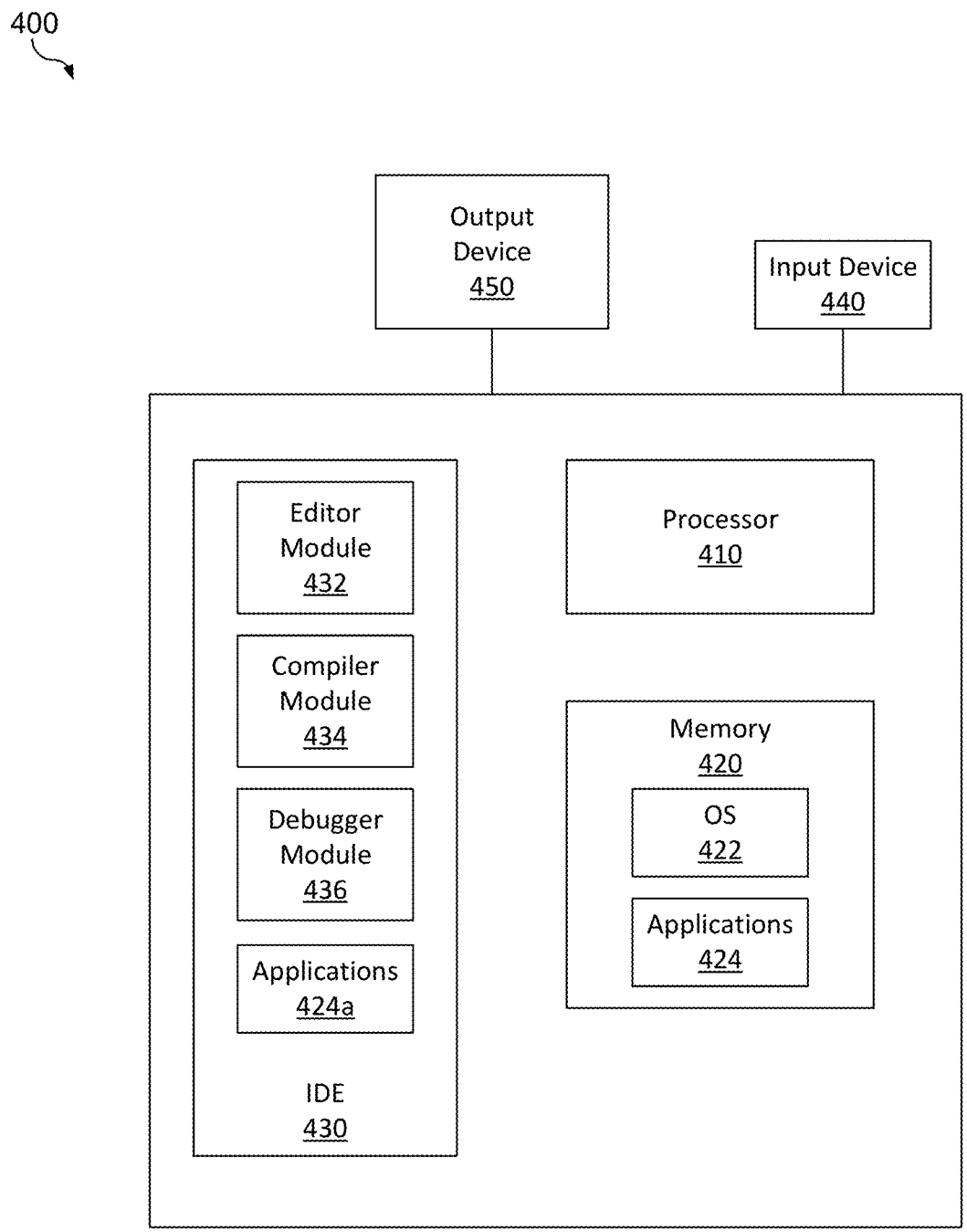
FIG. 4 is a block diagram illustrating an example of a computer system including an IDE that may be used to develop applications for a mobile device according to aspects of the present disclosure.

The IDE is a software application that provides comprehensive facilities to computer programmers for software development. The IDE may provide features for authoring, modifying, compiling, deploying, and debugging software applications. The IDE may provide the set of capabilities as a cohesive application. FIG. 4 is a block diagram illustrating an example of a computer system 400 including an IDE 430 that may be used to develop applications for a mobile device according to aspects of the present disclosure.

Referring to FIG. 4, the computer system 400 may include a processor 410, a memory 420, an IDE 430, an input device 440, and an output device 450. Although shown outside of memory 420, IDE may be resident in memory 420 can be executed by processor 410. As examples, the computer system 400 may be a tablet computer, a notebook computer, a laptop computer, a personal computer, a desktop computer, or another computer device. The architecture shown in FIG. 4 is only one example of an architecture the computer system 400. The computer system 400 can have more or fewer components than shown, or a different configuration of components. The various components shown in FIG. 4 can be implemented in hardware, software, or a combination of both hardware and software, including one or more signal processing and/or application specific integrated circuits. When referred to herein, a processor may include one or more processors.

The processor 410 may be, for example, but not limited to, a processing core, a microprocessor, a Field-Programmable Gate Array ("FPGA"), an application-specific integrated circuit ("ASIC"), etc. The processor 410 may run various software components stored in the memory 420 to perform various functions. In some embodiments, the software components may include an operating system (OS) 422 and other applications (or sets of instructions) 424.

Operating system 422 can be any suitable operating system, including iOS, Mac OS, Darwin, RTXC, LINUX, UNIX, OS X, WINDOWS, or an embedded operating system such as VxWorks. The operating system 422 can include various procedures, a plurality of instructions, software components and/or drivers for controlling and managing general system tasks (e.g., memory management, storage device control, power management, etc.) and facilitates communication between various hardware and software components.

The memory 420 may be RAM, ROM, and/or the like, internal storage (e.g., magnetic, optical, solid state storage, and/or organic) and/or other non-transitory computer-readable media, including magnetic media (e.g., disks and tapes), optical media (e.g., CD ROM, digital video disks, Blu-ray disks), solid state media (e.g., RAM, ROM, flash memory, solid-state storage), and other non-volatile storage or memory.

The IDE 430 may include a code editor module 432, a compiler module 434, and a debugger module 436. The code editor module 432 is a program for editing source code for software programs. Source-code editors may provide features such as syntax highlighting, indentation, autocomplete and brace matching functionality to enhance the code writing process. The code editor module 432 may also provide a way to run a compiler, interpreter, debugger, or other program relevant for the software-development process.

The compiler module 434 may translate computer code written in one programming language (the source language) into another language (the target language). For example, the compiler module 434 may translate source code from a high-level programming language to a lower level language (e.g., assembly language, object code, or machine code) to create an executable program.

The debugger module 436 may be used to test and debug a target program 424a (e.g., one of applications 424). The debugger module 436 may run the target program 424a, for example, an email application, under controlled conditions that permit the programmer to track the progress of the target program operations and monitor changes in computer resources that may indicate malfunctioning code. Applications under development, for example, mobile device applications, may be executed using the debugger to verify correct operation.

The input device 440 may be a device such as a keyboard, mouse, and/or track pad. In some embodiments, the input device 440 can include a touch-sensitive display that accepts user input. A touch-sensitive display surface can detect contact and any movement or release thereof using any suitable touch sensitivity technologies for determining one or more points of contact with the touch-sensitive display.

The output device 450 may be a display system, such as an LED (light emitting diode), LCD (liquid crystal display) technology, or LPD (light emitting polymer display) technology, or other display technology. The display may provide visual output to the user in a graphical user interface (GUI). The visual output can include text, graphics, video, and any combination thereof. Some or all of the visual output can correspond to user-interface objects.

IV. Simulation of Ranging

A simulator according to some aspects of the present disclosure may include a simulation computer, which may be the same or different than a developer computer used to code an application. The simulator can simulate the operations of mobile devices executing the application. Regardless of whether different computer systems are used, the developer software can integrate with the simulation software, e.g., by the simulation software being configured to receive and interpret the application, so as to simulate the operation of the application on the mobile devices. Further, regardless of whether separate computers are used for coding and simulation, an integrated development environment (IDE) can be considered to include development modules for coding the application and simulation modules for simulating the operation (e.g., hardware and software) of mobile devices and the operation of the application on the mobile devices.

Accordingly, the simulation computer system may simulate the operation of applications running on a mobile device, e.g., the always-on processor 330 and the application processor 340 of the mobile device 300. In particular, simulation of distance and direction between two or more mobile devices may occur. The simulator may provide realistic physical distance and physical direction data between the two mobile devices. As users develop applications based on spatial awareness for the mobile devices such as smart phones, tablets, smart watches, laptops, etc., responses of the applications based on physical distance and physical direction between the devices can be determined using the simulation rather than using two physical mobile devices.

The physical geometry of the devices being simulated may drive the availability of both the distance and the direction measurements. The simulator may make direction measurement available at certain times and unavailable at other times corresponding to the physical reality of the device locations. For example, the simulator may provide direction measurements for devices within a field of view of a device performing measurements, but only distance measurements may be provided when a device is outside the field of view of the measuring device.

A virtual coordinate system that adjusts for the physical layout of the computer's one or more display screens may be created. The virtual coordinate system may transform the physical coordinates of the one or more display screens into the virtual coordinate system corresponding to physical space in which physical devices would operate. For example, a display screen may have a resolution of 2048× 1020 pixels, with each pixel corresponding to an X,Y coordinate on the display screen, where pixel 0,0 may be the pixel in the upper left corner of the physical display screen and pixel 2047, 1019 may be the pixel in the lower right corner of the physical display screen.

The virtual coordinate system may transform physical coordinates of the display screen such that the pixel in the lower left corner of the physical display screen has the coordinate 0,0 and the pixel in the upper right corner of the physical display screen has the coordinate 1,1. Thus, each pixel of the physical display screen will have an X coordinate between zero and one, and a Y coordinate between zero and one. For example, each successive pixel in the horizontal (X) direction will have a coordinate value that changes by 1/2048, while each successive pixel in the vertical (Y) direction will have a coordinate value that changes by 1/1020. Distances determined in the virtual coordinate system may be scaled within the extents of the GUI to correspond to realistic distances related to physical devices in a physical coordinate system. A user can drag the simulated devices around the display screen to trigger the simulator to generate distance and direction measurements between the simulated devices. The simulator may deliver the measurements to the simulated devices just as if they were real physical devices.

A. System

Figure 5:
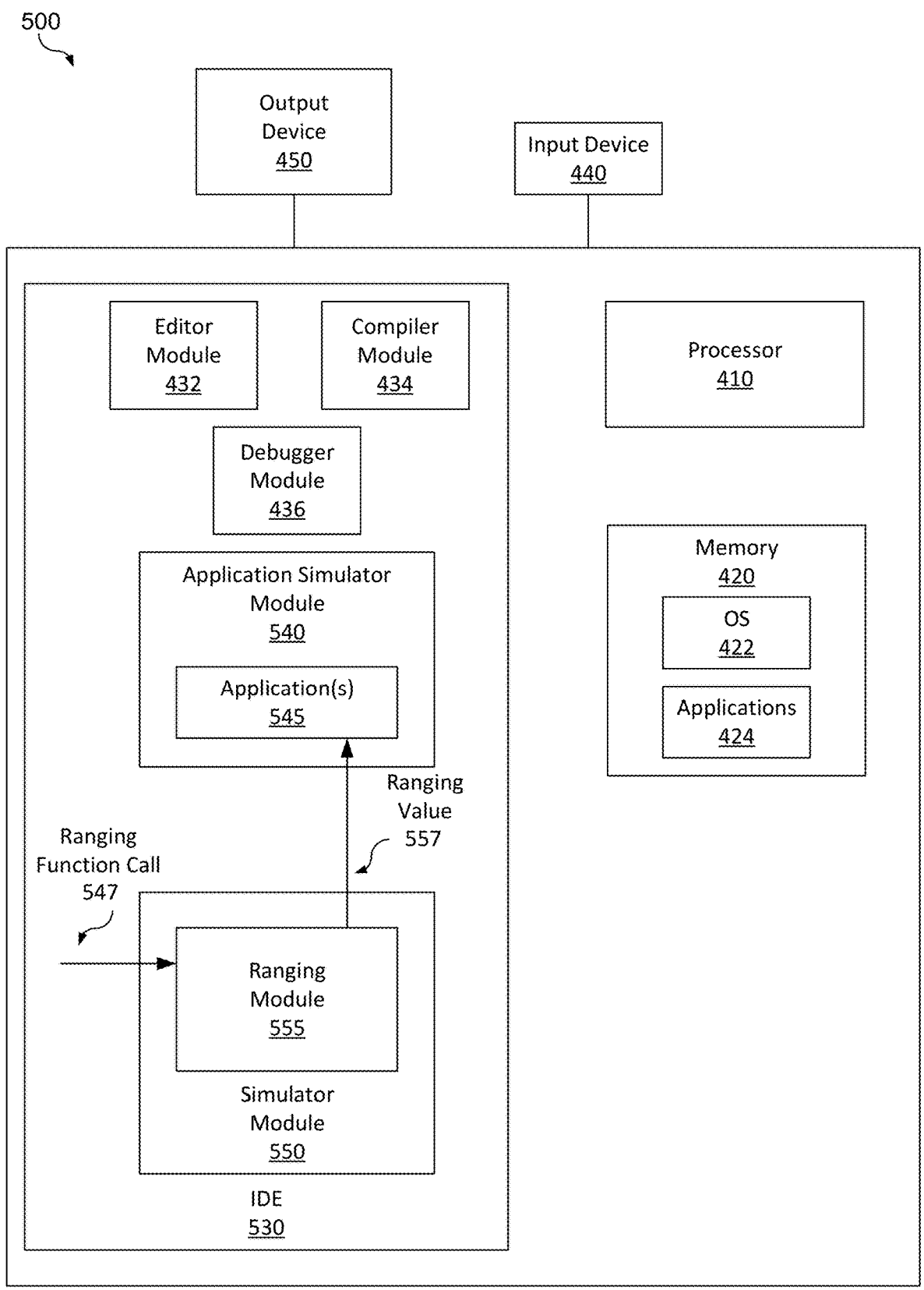
FIG. 5 is a block diagram illustrating an example of a computer system having an IDE including a simulator that may be used to develop spatially aware applications for a mobile device according to aspects of the present disclosure.

FIG. 5 is a block diagram illustrating an example of a computer system 500 having an IDE including a simulator that may be used to develop spatially aware applications for a mobile device according to aspects of the present disclosure. The computer system 500 of FIG. 5 may include a processor 410, a memory 420, an IDE 530, an input device 440, and an output device 450. The processor 410, memory 420, input device 440, and output device 450 have been explained with respect to FIG. 4 and their explanations will not be repeated here. The IDE 530 of FIG. 5 may be, for example, the IDE 430 of FIG. 4, and may include a code editor module 432, a compiler module 434, a debugger module 436, an application simulator module 540 and a device simulator module 550. The a code editor module 432, compiler module 434, and debugger module 436 have been explained with respect to FIG. 4 and their explanations will not be repeated here.

The application simulator module 540 may simulate the operation of an application executing on a simulated device rendered on the display screen. The device simulator module 550 may generate simulated devices for display on the display screen of the computer system. The device simulator module 550 may include a ranging module 555 configured to determine a simulated ranging value corresponding to a range between two physical devices, for example, between two mobile devices, between a mobile device and a computer, etc. The ranging module 555 may utilize an inverse stereographic projection technique to determine direction between the simulated devices. The direction angle may be determined as a function of distance and location on the display screen (e.g., based on an inverse stereographic projection).

The application simulator module 540 and device simulator module 550 may communicate with the processor of the computer system to receive code for simulating a first device and a second device. The received code may include code for executing applications 545, for example, a content sharing application, on one or both of the devices and code for rendering graphical representations of the first device and the second device on the GUI. The application simulator module 540 may receive ranging measurements from the device simulator module 550. For example, a ranging function call 547 may be received by the ranging module 555 of the device simulator module 550. The ranging function call 547 may be triggered by the user dragging one of the simulated devices on the GUI, or may be received from another component of the IDE 530. In response to the ranging function call 547, the ranging module 555 may provide a ranging value to the application simulator module 540. In some implementations, the ranging module 555 may periodically provide ranging values to the application simulator module 540 without receiving a ranging function call. The ranging values may include a separation value (e.g., distance) and direction between the devices. In some cases, for example, if one device is outside the field of view of the other device, the ranging value may include the separation value but not the direction.

The application simulator module 540 and the device simulator module 550 may operate automatically to make function calls and receive ranging values, or periodically generate and receive ranging values. Thus, instead of distance and direction being provided by ultra-wide band (UWB) communication between physical devices, the values are provided through the simulator.

B. User Interface

Figure 6:
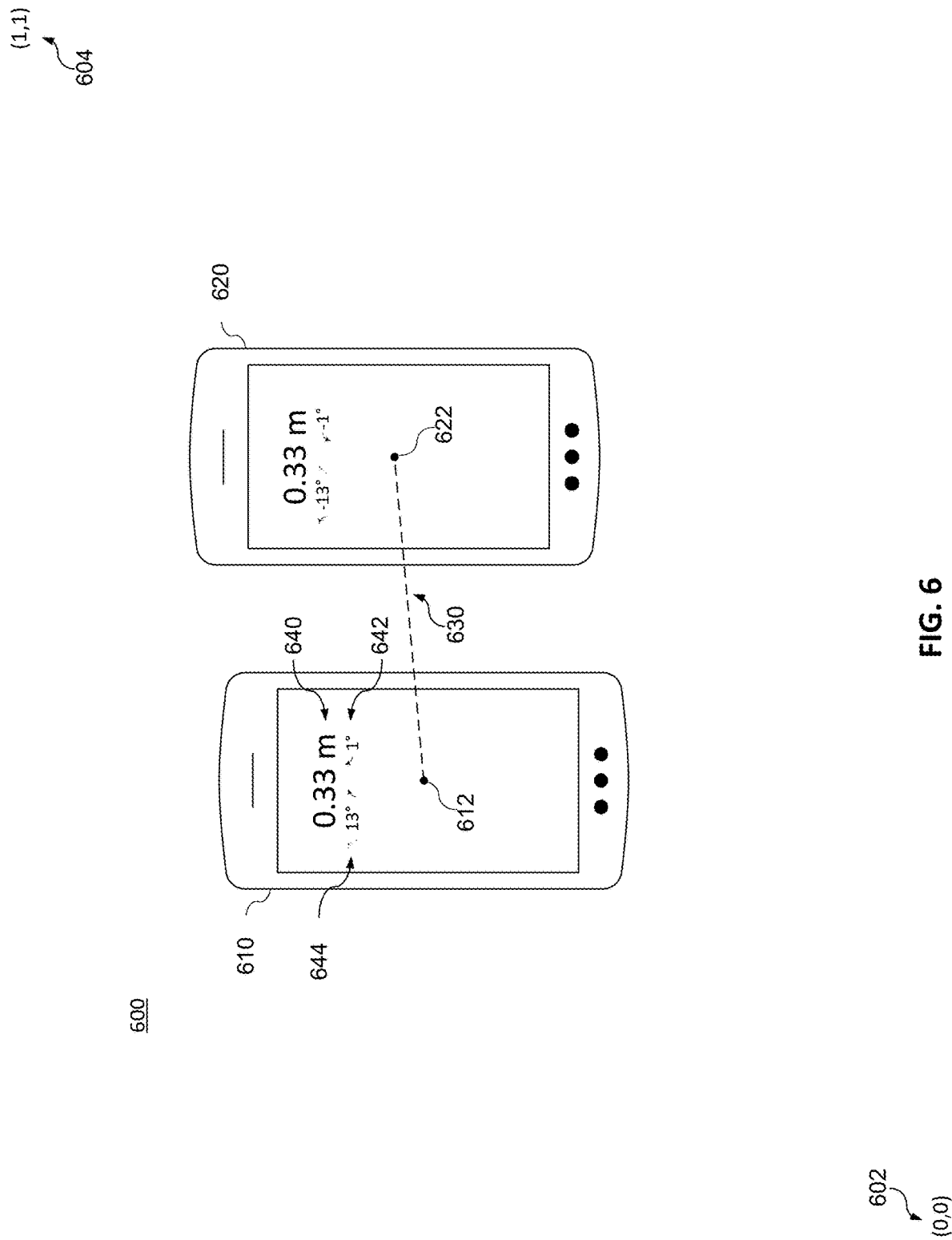
FIG. 6 is a diagram illustrating an example of a graphical user interface (GUI) according to aspects of the present disclosure.

FIG. 6 is a diagram illustrating an example of user interface according to aspects of the present disclosure. FIG. 6 shows two devices 610, 620 in a display window 600 generated by the device simulator module 550. The device simulator module 550 may create a virtual coordinate system that adjusts for the physical layout of the computer display devices. As shown in FIG. 6, the device simulator module 550 may assign the virtual coordinate (0,0) 602 to the lower left corner of the display screen and may assign the virtual coordinate (1,1) 604 to the upper right corner of the display screen. For example, the space might be rectangular, so the horizontal axis might scale differently than the vertical axis. In cases where multiple screens are available, device simulator module 550 may assign the window coordinates (0,0) and (1,1) to the lower left corner and the upper right corner, respectively, of the composite display screen formed by the multiple screens as defined by the physical display configuration of the computer system. Thus, all of the positions and sizes of the simulated devices may be normalized to that coordinate space, and the origin is translated to be the lowest left most coordinate 0,0 irrespective of how the multiple display screens are laid out. The origin, size, and center pixel corresponding to the center point of the simulated device within the system may be calculated without the simulated device having any knowledge of the configuration of the displays connected to the computer.

The location of each simulated device in the coordinate system may be determined based on a center pixel of the simulated device. The center pixels may be determined as the geometric centers of the devices rendered on the display screen of the GUI. For example, the location of the first device 610 be determined by the center pixel 612, and the location of the second device 620 be determined by the center pixel 622. As illustrated in FIG. 6, the distance 630 between the first device 610 and the second device 620 may be determined by the ranging module 555 as a distance (e.g., separation value) between the center pixel 612 of the first device 610 and the center pixel 622 of the second device 620. In some implementations, other pixels may be selected to determine the distance between devices. For example, a distance between pixels located at positions corresponding to antenna locations of the devices may be selected for calculating the distance between devices. In some implementations, the center pixel may be moved to change the location of a device independent of the graphical representation of the device. For example, a small device such as a smart watch may have a graphical representation that makes displaying distance and angle information impractical. The center pixel of the device may be selected to change the device location while the graphical representation remains stationary. In some implementations, the graphical representation may then be expanded to display the distance and angle information. In some implementations, the distance and angle information may be displayed in a separate window on the display.

Distance (e.g., separation value) between the simulated devices may be computed based on the sum-of-the-squares distance of the horizontal and vertical distances between the center pixels of the two simulated devices or any other fixed point on the simulated devices. The computed distance may be multiplied by a scaling factor to provide a realistic physical distance corresponding to two physical devices in a physical coordinate system. For example, the virtual coordinates may be scaled within the extents of the GUI such that the distance between two simulated devices located at opposite ends of the display screen(s) is approximately two meters. The simulated distance between devices may be used to cause the application being simulated by the application simulator module 540 to trigger an interaction or event. For example, a device may trigger a haptic event, e.g., shaking the device, when the simulated distance corresponds to a specified physical distance between two physical devices.

Each simulated device may display the distance as well as direction (azimuth and elevation) between devices. In some cases, such as when a device is not within the field of view, direction information may not be provided. As shown in FIG. 6, a distance display 640, an azimuth display 644, and an elevation display 642 may be shown on the simulated devices. The azimuth and elevation angles may be determined based on stereographic projection as explained below. In some implementations, rather than being displayed on the simulated devices, the distance and direction information may be displayed on the GUI in a separate window corresponding to each device. The azimuth display 644 may include arrows indicating the relative direction of the angle between the devices. In FIG. 6, the azimuth display 644 for the first device 610 shows an arrow pointing to the right indicating the direction to the second device 620. Similarly, the azimuth display for the second device 620 shows an arrow pointing to the left indicating the direction to the first device 610.

The elevation display 642 may also include arrows indicating the relative direction of the elevation angle between the devices. The elevation display 642 for the first device 610 shows an arrow pointing upward indicating the direction to the second device 620. The elevation display for the second device 620 shows an arrow pointing downward indicating the direction to the first device 610.

The device simulator module 550 may simulate more than two devices. For example, there may be multiple devices in a room, where each is ranging with each other.

Figure 7:
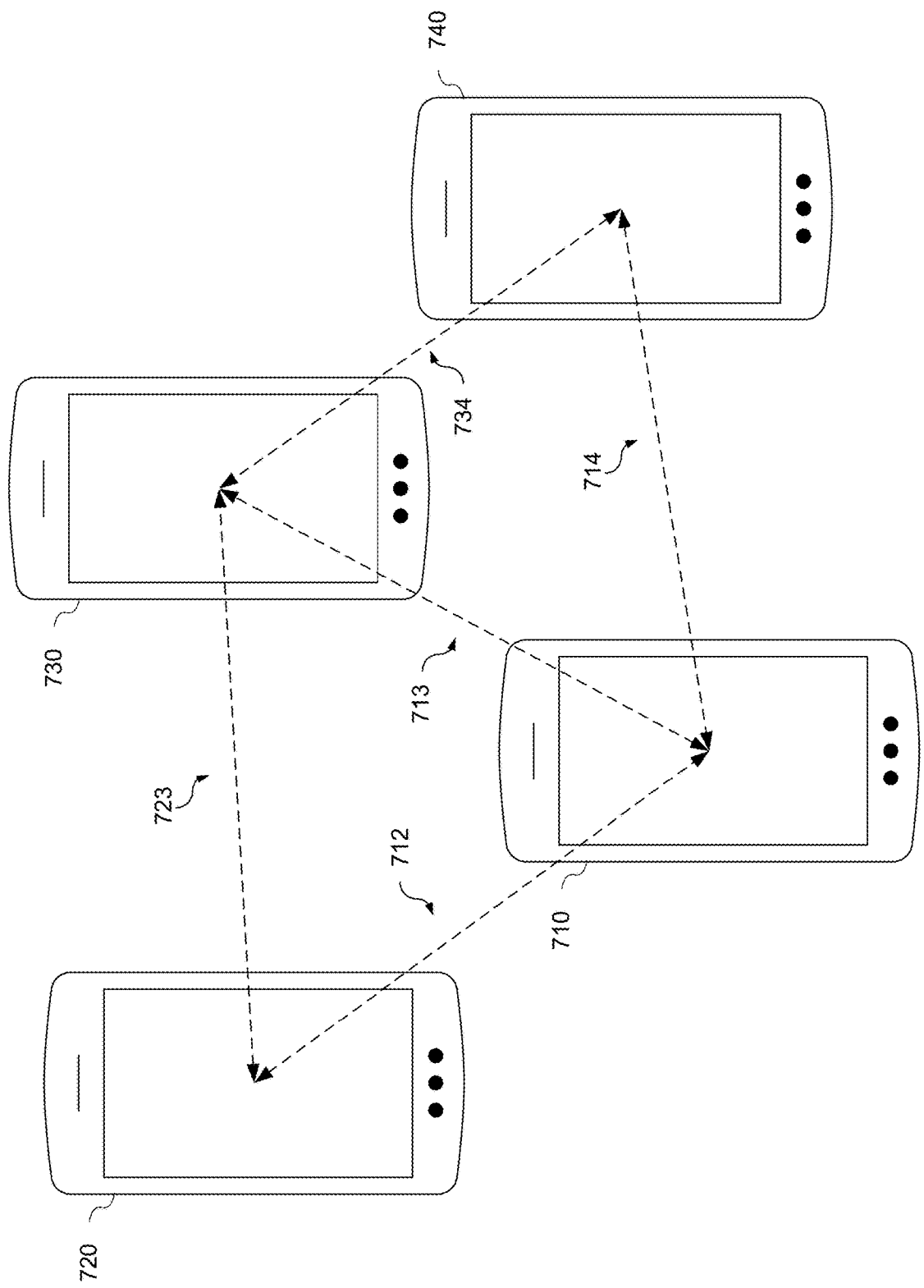
FIG. 7 is a diagram illustrating an example of a graphical user interface (GUI) showing multiple devices according to aspects of the present disclosure.

FIG. 7 is a diagram illustrating an example of a graphical user interface (GUI) showing multiple devices according to aspects of the present disclosure. Referring to FIG. 7, the device simulator module 550 may simulate first through fourth devices 710, 720, 730, 740. The device simulator module 550 may provide distance information and direction information (if available) between each of the simulated devices. Each simulated device may display the distance and direction information to every other simulated device. The line 712 illustrates the distance and direction between the first device 710 and the second device 720. The line 713 illustrates the distance and direction between the first device 710 and the third device 730. The line 714 illustrates the distance and direction between the first device 710 and the fourth device 740. The line 723 illustrates the distance and direction between the second device 720 and the third device 730. The line 734 illustrates the distance and direction between the third device 730 and the fourth device 740. In some implementations, a simulated device may display distance and direction information to specified ones of the other simulated devices. In other implementations, the distance and direction information between the devices may be displayed in separate windows corresponding to the devices. When one of the first through fourth devices 710, 720, 730, 740 moves, a function call may be triggered for determining the location of each device. If it is determined that the location of any of the devices has changed, updated distance information and direction information (if available) may be provided to each of the first through fourth devices 710, 720, 730, 740.

Distance and direction values may be provided by the ranging module 555 for simulated devices within a field of view of a simulated device requesting the ranging values. For a simulated device outside the field of view of the requesting device, only the distance value may be provided by the ranging module 555.

Figure 8:
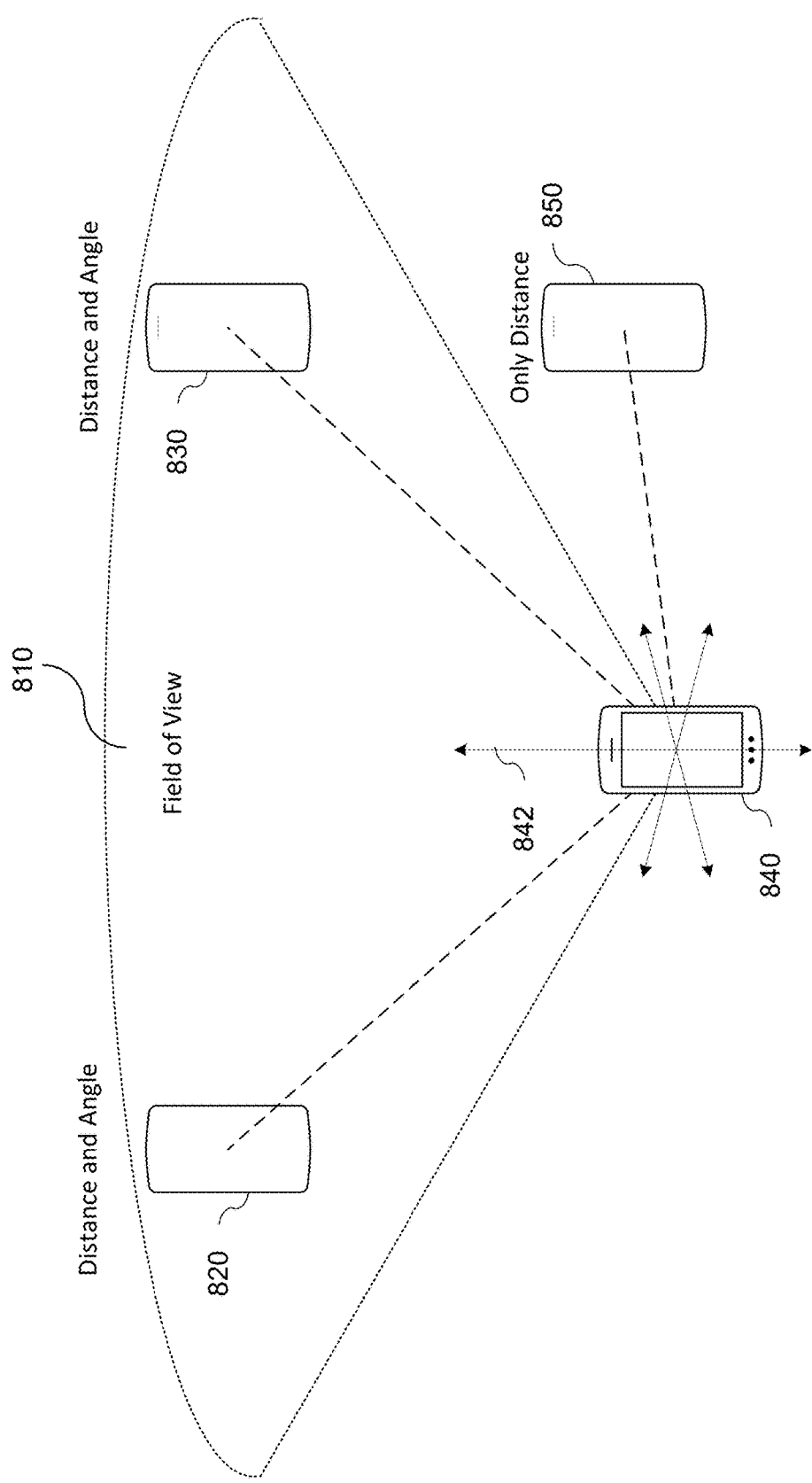
FIG. 8 is a diagram illustrating a field of view of a simulated device according to aspects of the present disclosure.

FIG. 8 is a diagram illustrating a field of view of a simulated device according to aspects of the present disclosure. In FIG. 8, a first simulated device 840, may have a field of view 810. The field of view 810 may be limited by the ranging module 555 to angles of ±45 degrees or another value from an axis 842 of the first device 840. Thus, the field of view 810 for the first simulated device 840 may be visualized as a sector of a circle spanning approximately 90 degrees with the first simulated device 840 positioned at the center of the circle. A second simulated device 820 and a third simulated device 830 may lie within the field of view of the first simulated device 840. For devices within the field of view 810 of the first simulated device 840, distance and direction (azimuth and elevation) values may be provided by the ranging module 555. As also shown in FIG. 8, a third simulated device 850 may lie outside the field of view 810 of the first simulated device 840. Since the third simulated device 850 lies outside the field of view 810 of the first simulated device 840, only a value for the distance between the first simulated device 840 and the third simulated device 850 may be provided by the ranging module 555. The ranging module 555 may also limit the elevation to angles of ±45 degrees or another value perpendicular to the defined field of view. The device simulator module 550 may provide an indication that the azimuth and elevation values are not available when a simulated device is outside the defined azimuth and elevation limits.

C. Determination of Distance

The distance between a first simulated device and a second simulated device may be determined as the difference between the pixel center of first simulated device and the pixel center of the second simulated device as explained with respect to FIG. 6 (e.g., the distance 630).

Referring to FIG. 6, if it is determined that the first simulated device 610 has a center pixel 612 at a first location, then when the second simulated device 620 is moved around as determined by the location of its center pixel 622, the distance (or separation value) between the first and second devices may be computed based on the location of the center pixel 622 of the second simulated device 620 with respect to the location of the center pixel 612 of the first simulated device 610.

The virtual coordinate system may transform physical coordinates of the display screen such that each pixel of the physical display screen will have an X (horizontal) coordinate between zero and one, and a Y (vertical) coordinate between zero and one. For example, a display screen may have a 2048 pixels corresponding to coordinates in the horizontal direction and 1020 pixels corresponding to coordinates in the vertical direction. When transformed to the virtual coordinate system, a pixel having coordinates of (500, 500) in the physical coordinates of the display screen will have coordinates (0.2441, 0.4902). A sum-of-the-squares distance of the horizontal and vertical distances between the center pixels of the two simulated devices in the virtual coordinate system may be computed to determine the distance between the two devices. A scaling factor may be applied to provide a realistic distance corresponding to two physical devices in a physical coordinate system. For example, a full scale horizontal distance value may correspond to two meters or another value, while a full scale vertical distance value may correspond to the same or a different value.

D. Angle as a Function of Distance

The ranging module 555 of the device simulator module 550 may determine distance and direction between the simulated devices based on stereographic projection techniques. An inverse stereographic projection technique may be employed to project the two-dimensional (2D) simulation plane onto a three-dimensional (3D) sphere to simulate the physical distance and physical direction between physical devices.

Figure 9:
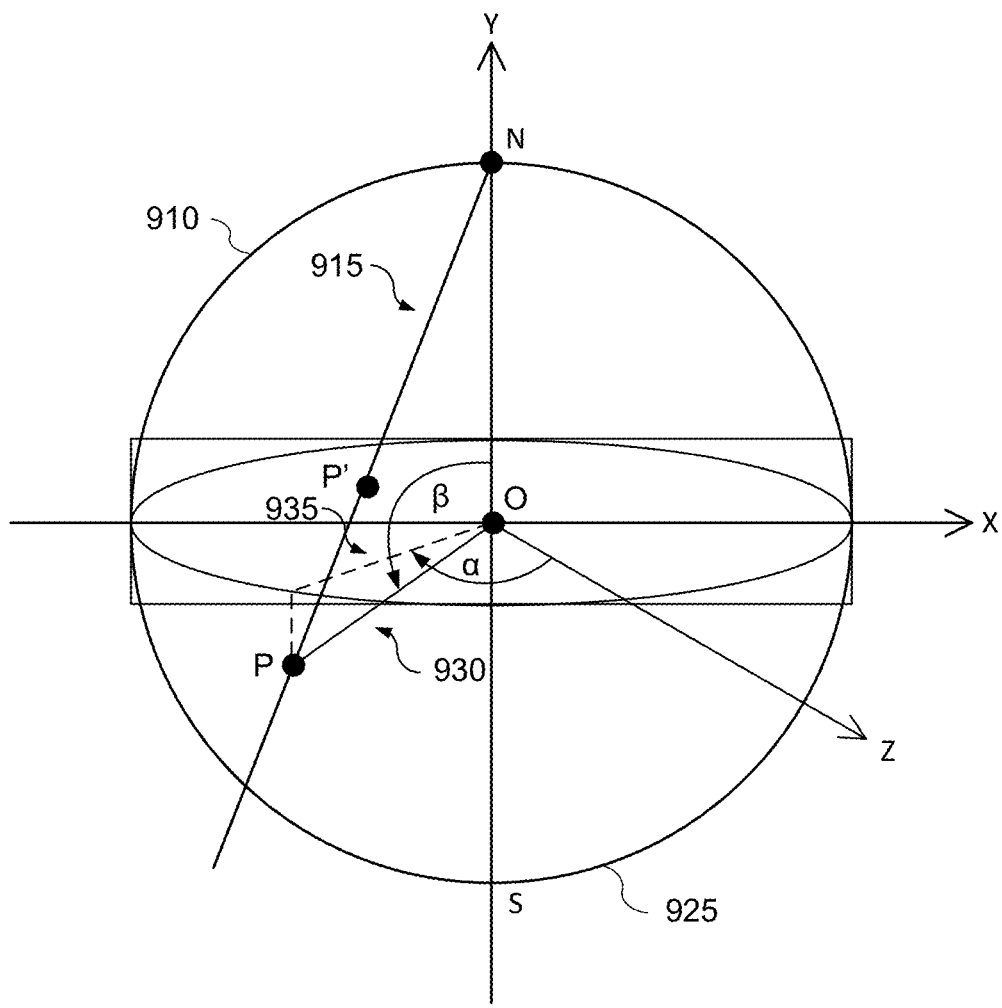
FIG. 9 is a diagram illustrating characteristics of stereographic projection according to aspects of the present disclosure.

FIG. 9 is a diagram illustrating characteristics of stereographic projection according to aspects of the present disclosure. In FIG. 9, it may be assumed that a display screen is a plane that runs through the middle of a globe or unit sphere 910 analogous to the display screen running through the plane of earth's equator (e.g., a plane perpendicular to the page along the X-axis). A center point of a first simulated device may be located at the point O in the plane and a center point of a second simulated device may be located at a point P' in the plane. The center points of the simulated devices may be the device locations reported by the device simulator module 550. The simulator may determine ranging values for the first simulated device located at the point O to the second simulated device located at a point P' using stereographic projection techniques.

A projection point N may be selected at the north pole. A ray 915 may be projected from the projection point N through the center point P' of the second simulated device (e.g., the center pixel of the second simulated device) that lies in the equatorial plane to a point P where the ray 915 intersects the unit sphere 910. This inverse projection projects the second simulated device at point P' in the 2D plane onto the 3D unit sphere 910 at the point P. With the first simulated device located at the point O facing the north pole S, the second simulated device projected onto the southern hemisphere 925 of the unit sphere 910 at point P will be inside of the field of view of the first simulated device.

The first simulated device is assumed to be located at the center of the unit sphere 910 at point O may be sitting flat on that equatorial plane and facing the north pole. The second simulated device is then assumed to be on the surface of the unit sphere 910 at point P. Both devices, from their viewpoint, think they are at the center of the unit sphere 910, thereby enabling a symmetric relationship between the two devices as they move around.

1. Distance to P'

The distance between the first simulated device located at the point O and the second simulated device located at the point P' may be determined as the difference between the pixel center of first simulated device and the pixel center of the second simulated device as explained with respect to FIG. 6 (e.g., the distance 630). The device simulator module 550 may provide a normalization that re-centers the simulated device requesting a ranging measurement to the center of the unit sphere 910 such that when the point P' in the plane is projected onto point P on the unit sphere 910, the simulated devices have been renormalized to the simulated device requesting the ranging measurement being at the center of the unit sphere.

Referring again to FIG. 6, if it is assumed that the first simulated device 610 is at the origin O of the unit sphere 910, then as the second simulated device 620 is moved around, the point P' may be computed directly as the location of the center pixel 622 of the second simulated device 620 minus location of the center pixel 612 of the first simulated device 610 (the scaled pixel center distance 630).

2. Direction (Angle)

The simulated devices are created in simulated 3D location in space. The further away the simulated devices are on the display screen, the greater the angles between them will be. Returning to FIG. 9, the direction between the first simulated device located at the point O and the second simulated device located at point P' may be determined based on the projection of the location of the second simulated device to the point P on the unit sphere 910. As shown in FIG. 9, a line 930 may be drawn between the center of the first simulated device located at the point O and the center of the projection of the second simulated device at the point P on the unit sphere 910.

An azimuth angle α may be determined as an angle in the X-Z plane between the Z-axis and the line 935 which is a projection of the line 930 from the point O to the point P onto the X-Z plane. An elevation angle β may be determined as an angle in the plane formed by the Y-axis and the ray 915. As the second simulated device is moved in the X-Y plane, the point P' may move in the X-Y plane closer to or further away from the point O. As the point P' moves, the projection of the second simulated device at the point P moves along the surface of the unit sphere 910 causing the azimuth angle α and/or the elevation angle β to change proportionally. The ranging module 555 of the device simulator module 550 may compute the direction between the first simulated device and the second simulated device as the azimuth angle α and the elevation angle β.

The reported direction the simulated devices may be limited based on the azimuth and elevation angles. When the azimuth angle or elevation angle exceeds a specified value, for example, ±45 degrees or another value, the device simulator module 550 may provide an indication that the azimuth or elevation values are not available. A user of the simulator may use azimuth and elevation angles, for example, to cause an application to trigger a haptic event when it is determined that a simulated device is pointing in a particular direction (e.g., at another simulated device).

While the above-described embodiments employ stereographic projection techniques to provide changes in angle to simulate realistic movements of physical devices, other functional relationships between distance and direction that provide continuous (smooth) mapping functions from 3D to 2D spherical surface, for example, but not limited to, Mercator projections, Transverse Mercator projections, Roussilhe projections, Lambert conformal conic projections, Peirce quincuncial projections, Adams hemisphere-in-a-square projections, Guyou hemisphere-in-a-square projections, etc., may be used without departing from the scope of the present disclosure.

V. Flowchart

Some aspects of the present disclosure provide methods for simulating an application that uses ranging functionality for determining a distance and direction between two simulated devices. The methods can aid in developing applications that employ such ranging functionality without having to perform physical tests using physical devices in a real world environment. For example, methods can be performed in an integrated development environment (IDE) to determine relative locations of virtual devices on a screen and provide ranging data to software applications being simulated on the virtual devices. Such techniques can be performed by computer system 500 in FIG. 5.

Figure 10:
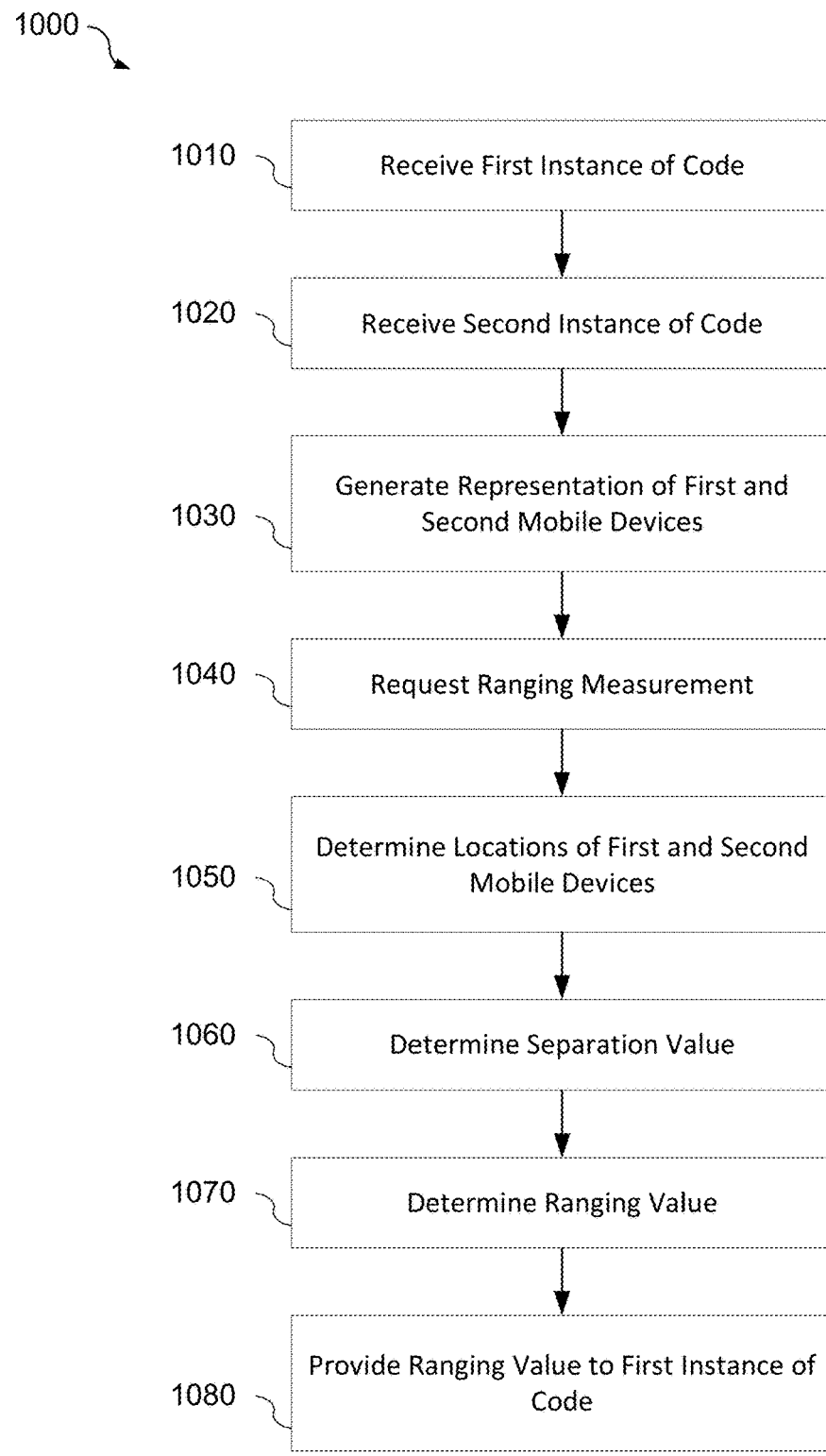
FIG. 10 is a flowchart illustrating a method for simulating nearby interactions of devices according to aspects of the present disclosure.

FIG. 10 is a flowchart illustrating a method for simulating nearby interactions of devices according to aspects of the present disclosure. The method generates simulated devices and determines simulated ranging values that provide realistic physical distance and physical direction data between the simulated devices as would be obtained by physical devices.

At block 1010, a first instance of code may be received by a device simulator module (e.g., the device simulator module 550). The first instance of code may enable the simulation module to generate a first simulated device. The first simulated device may be a mobile device, for example, a smart phone, tablet, smart watch, laptop, etc.

At block 1020, a second instance of code may be received by the device simulation module. The second instance of code may enable the simulation module to generate a second simulated device. The second simulated device may be, for example, a mobile device, for example, a smart phone, tablet, smart watch, laptop, etc.

At block 1030, a graphical representations of the first and second simulated devices may be generated. The graphical representations may be generated in a GUI on a two-dimensional display screen. For example, the device simulation module may create a virtual coordinate system that adjusts for the physical layout of the computer display devices. Coordinate (0,0) may be assigned to the lower left corner of the display screen and the coordinate (1,1) may be assigned to the upper right corner of the display screen. In cases where multiple screens are available, the device simulator module may transform the on-screen window coordinates (0,0) and (1,1) to the lower left corner and the upper right corner, respectively, of the composite display screen as defined by the physical display configuration of the computer system. Thus, all of the positions and sizes of the simulated devices may be normalized to that coordinate space.

At block 1040, a ranging measurement may be requested. The ranging measurement may be requested by ranging function call to a ranging module (e.g., the ranging module 555) of the device simulator module. The ranging function call may be triggered by the user dragging one of the simulated devices on the GUI. In some implementations, the ranging module may periodically provide ranging values without receiving a ranging function call.

At block 1050, locations of the first and second simulated devices may be determined. The location of each simulated device in the coordinate system may be determined based on a center pixel of the simulated device. For example, referring to FIG. 6, the location of the first device 610 be determined by the center pixel 612, and the location of the second device 620 be determined by the center pixel 622.

At block 1060, a separation value between the first and second simulated devices may be determined. Referring to FIG. 6, a distance 630 between the first device 610 and the second device 620 may be determined by the ranging module as a distance between the center pixel 612 of the first device 610 and the center pixel 622 of the second device 620. The center pixels may be the geometric centers of the devices rendered on the display screen of the GUI. In some implementations, other pixels may be selected to determine the distance between devices. For example, a distance between pixels located at positions corresponding to antenna locations of the devices may be selected for calculating the distance between devices.

At block 1070, a ranging value may be determined. Distance and direction values may be provided by the ranging module for simulated devices within a field of view of a simulated device requesting the ranging values. For a simulated device outside the field of view of the requesting device, only the distance value may be provided by the ranging module. The distance value may be determined as a distance between center pixels of the simulated devices as explained with respect to FIG. 6. Direction values (e.g., azimuth and elevation angles) may be determined based on stereographic projection techniques as described with respect to FIG. 9.

At block 1080, a ranging value may be provided to the first instance of code. The device simulator module may return a ranging value (e.g., distance, azimuth angle, elevation angle) to the first instance of code corresponding to a simulated device requesting the ranging value. The first instance of code may use the ranging value for simulating a physical ranging measurement between two physical devices.

In some embodiments, some or all of the operations described herein can be performed using an application executing on the user's device. Circuits, logic modules, processors, and/or other components may be configured to perform various operations described herein. Those skilled in the art will appreciate that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on.

VI. Example Device

Figure 11:
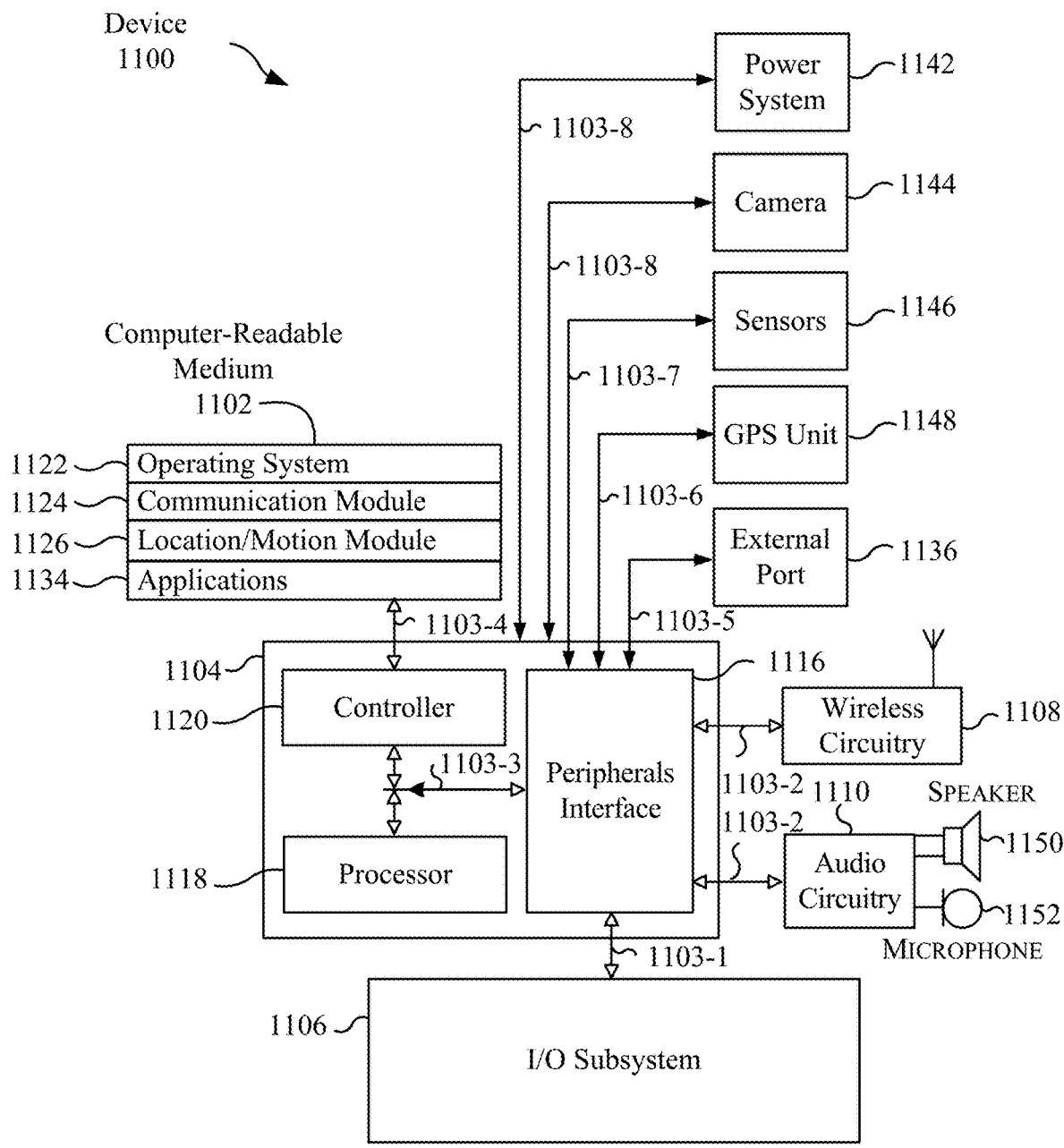
FIG. 11 is a block diagram of an example of a device according to aspects of the present disclosure.

FIG. 11 is a block diagram of an example device 1100, which may be a mobile device. The example device 1100 may be one of the mobile devices executing an application or the example device 1100 may be the system performing the simulation. Device 1100 generally includes computer-readable storage medium 1102, a processing system 1104, an Input/Output (I/O) subsystem 1106, wireless circuitry 1108, and audio circuitry 1110 including speaker 1150 and microphone 1152. These components may be coupled by one or more communication buses or signal lines 1103. Device 1100 can be any portable electronic device, including a handheld computer, a tablet computer, a mobile phone, laptop computer, tablet device, media player, personal digital assistant (PDA), a key fob, a car key, an access card, a multi-function device, a mobile phone, a portable gaming device, a vehicle display device, or the like, including a combination of two or more of these items.

It should be apparent that the architecture shown in FIG. 11 is only one example of an architecture for device 1100, and that device 1100 can have more or fewer components than shown, or a different configuration of components. The various components shown in FIG. 11 can be implemented in hardware, software, or a combination of both hardware and software, including one or more signal processing and/or application specific integrated circuits.

Wireless circuitry 1108 is used to send and receive information over a wireless link or network to one or more other devices' conventional circuitry such as an antenna system, an RF transceiver, one or more amplifiers, a tuner, one or more oscillators, a digital signal processor, a CODEC chipset, memory, etc. Wireless circuitry 1108 can use various protocols, e.g., as described herein.

Wireless circuitry 1108 is coupled to processing system 1104 via peripherals interface 1116. Interface 1116 can include conventional components for establishing and maintaining communication between peripherals and processing system 1104. Voice and data information received by wireless circuitry 1108 (e.g., in speech recognition or voice command applications) is sent to one or more processors 1118 via peripherals interface 1116. One or more processors 1118 are configurable to process various data formats for one or more application programs 1134 stored on medium 1102.

Peripherals interface 1116 couple the input and output peripherals of the device to processor 1118 and computer-readable storage medium 1102. One or more processors 1118 communicate with computer-readable storage medium 1102 via a controller 1120. Computer-readable storage medium 1102 can be any device or medium that can store code and/or data for use by one or more processors 1118. Medium 1102 can include a memory hierarchy, including cache, main memory and secondary memory.

Device 1100 also includes a power system 1142 for powering the various hardware components. Power system 1142 can include a power management system, one or more power sources (e.g., battery, alternating current (AC)), a recharging system, a power failure detection circuit, a power converter or inverter, a power status indicator (e.g., a light emitting diode (LED)) and any other components typically associated with the generation, management and distribution of power in mobile devices.

In some embodiments, device 1100 includes a camera 1144. In some embodiments, device 1100 includes sensors 1146. Sensors can include accelerometers, compass, gyrometer, pressure sensors, audio sensors, light sensors, barometers, and the like. Sensors 1146 can be used to sense location aspects, such as auditory or light signatures of a location.

In some embodiments, device 1100 can include a GPS receiver, sometimes referred to as a GPS unit 1148. A mobile device can use a satellite navigation system, such as the Global Positioning System (GPS), to obtain position information, timing information, altitude, or other navigation information. During operation, the GPS unit can receive signals from GPS satellites orbiting the Earth. The GPS unit analyzes the signals to make a transit time and distance estimation. The GPS unit can determine the current position (current location) of the mobile device. Based on these estimations, the mobile device can determine a location fix, altitude, and/or current speed. A location fix can be geographical coordinates such as latitudinal and longitudinal information.

One or more processors 1118 run various software components stored in medium 1102 to perform various functions for device 1100. In some embodiments, the software components include an operating system 1122, a communication module (or set of instructions) 1124, a location module (or set of instructions) 1126, a recipient suggestion module (or set of instructions) 1128, and other applications (or set of instructions) 1134, such as a car locator app and a navigation app.

Operating system 1122 can be any suitable operating system, including iOS, Mac OS, Darwin, RTXC, LINUX, UNIX, OS X, WINDOWS, or an embedded operating system such as VxWorks. The operating system can include various procedures, a plurality of instructions, software components and/or drivers for controlling and managing general system tasks (e.g., memory management, storage device control, power management, etc.) and facilitates communication between various hardware and software components.

Communication module 1124 facilitates communication with other devices over one or more external ports 1136 or via wireless circuitry 1108 and includes various software components for handling data received from wireless circuitry 1108 and/or external port 1136. External port 1136 (e.g., USB, FireWire, Lightning connector, 60-pin connector, etc.) is adapted for coupling directly to other devices or indirectly over a network (e.g., the Internet, wireless LAN, etc.).

Location/motion module 1126 can assist in determining the current position (e.g., coordinates or other geographic location identifier) and motion of device 1100. Modern positioning systems include satellite based positioning systems, such as Global Positioning System (GPS), cellular network positioning based on "cell IDs," and Wi-Fi positioning technology based on a Wi-Fi networks. GPS also relies on the visibility of multiple satellites to determine a position estimate, which may not be visible (or have weak signals) indoors or in "urban canyons." In some embodiments, location/motion module 1126 receives data from GPS unit 1148 and analyzes the signals to determine the current position of the mobile device. In some embodiments, location/motion module 1126 can determine a current location using Wi-Fi or cellular location technology. For example, the location of the mobile device can be estimated using knowledge of nearby cell sites and/or Wi-Fi access points with knowledge also of their locations. Information identifying the Wi-Fi or cellular transmitter is received at wireless circuitry 1108 and is passed to location/motion module 1126. In some embodiments, the location module receives the one or more transmitter IDs. In some embodiments, a sequence of transmitter IDs can be compared with a reference database (e.g., Cell ID database, Wi-Fi reference database) that maps or correlates the transmitter IDs to position coordinates of corresponding transmitters, and computes estimated position coordinates for device 1100 based on the position coordinates of the corresponding transmitters. Regardless of the specific location technology used, location/motion module 1126 receives information from which a location fix can be derived, interprets that information, and returns location information, such as geographic coordinates, latitude/longitude, or other location fix data.

The one or more applications 1134 on the mobile device can include any applications installed on the device 1100, including without limitation, a browser, an address book, a contact list, email, instant messaging, video conferencing, video calling, word processing, keyboard emulation, widgets, JAVA-enabled applications, encryption, digital rights management, voice recognition, voice replication, a music player (which plays back recorded music stored in one or more files, such as MP3 or AAC files), etc.

There may be other modules or sets of instructions (not shown), such as a graphics module, a time module, etc. For example, the graphics module can include various conventional software components for rendering, animating and displaying graphical objects (including without limitation text, web pages, icons, digital images, animations and the like) on a display surface. In another example, a timer module can be a software timer. The timer module can also be implemented in hardware. The time module can maintain various timers for any number of events.

The I/O subsystem 1106 can be coupled to a display system (not shown), which can be a touch-sensitive display. The display displays visual output to the user in a GUI. The visual output can include text, graphics, video, and any combination thereof. Some or all of the visual output can correspond to user-interface objects. A display can use LED (light emitting diode), LCD (liquid crystal display) technology, or LPD (light emitting polymer display) technology, although other display technologies can be used in other embodiments.

In some embodiments, I/O subsystem 1106 can include a display and user input devices such as a keyboard, mouse, and/or track pad. In some embodiments, I/O subsystem 1106 can include a touch-sensitive display. A touch-sensitive display can also accept input from the user based on haptic and/or tactile contact. In some embodiments, a touch-sensitive display forms a touch-sensitive surface that accepts user input. The touch-sensitive display/surface (along with any associated modules and/or sets of instructions in medium 1102) detects contact (and any movement or release of the contact) on the touch-sensitive display and converts the detected contact into interaction with user-interface objects, such as one or more soft keys, that are displayed on the touch screen when the contact occurs. In some embodiments, a point of contact between the touch-sensitive display and the user corresponds to one or more digits of the user. The user can make contact with the touch-sensitive display using any suitable object or appendage, such as a stylus, pen, finger, and so forth. A touch-sensitive display surface can detect contact and any movement or release thereof using any suitable touch sensitivity technologies, including capacitive, resistive, infrared, and surface acoustic wave technologies, as well as other proximity sensor arrays or other elements for determining one or more points of contact with the touch-sensitive display.

Further, the I/O subsystem can be coupled to one or more other physical control devices (not shown), such as pushbuttons, keys, switches, rocker buttons, dials, slider switches, sticks, LEDs, etc., for controlling or performing various functions, such as power control, speaker volume control, ring tone loudness, keyboard input, scrolling, hold, menu, screen lock, clearing and ending communications and the like. In some embodiments, in addition to the touch screen, device 1100 can include a touchpad (not shown) for activating or deactivating particular functions. In some embodiments, the touchpad is a touch-sensitive area of the device that, unlike the touch screen, does not display visual output. The touchpad can be a touch-sensitive surface that is separate from the touch-sensitive display or an extension of the touch-sensitive surface formed by the touch-sensitive display.

In some embodiments, some or all of the operations described herein can be performed using an application executing on the user's device. Circuits, logic modules, processors, and/or other components may be configured to perform various operations described herein. Those skilled in the art will appreciate that, depending on implementation, such configuration can be accomplished through design, setup, interconnection, and/or programming of the particular components and that, again depending on implementation, a configured component might or might not be reconfigurable for a different operation. For example, a programmable processor can be configured by providing suitable executable code; a dedicated logic circuit can be configured by suitably connecting logic gates and other circuit elements; and so on.

Any of the software components or functions described in this application may be implemented as software code to be executed by a processor using any suitable computer language such as, for example, Java, C, C++, C#, Objective-C, Swift, or scripting language such as Perl or Python using, for example, conventional or object-oriented techniques. The software code may be stored as a plurality of instructions or commands on a computer-readable storage medium for storage and/or transmission. A suitable non-transitory computer-readable storage medium can include random access memory (RAM), a read only memory (ROM), a magnetic medium such as a hard-drive or a floppy disk, or an optical medium such as a compact disk (CD) or DVD (digital versatile disk), flash memory, and the like. The computer-readable storage medium may be any combination of such storage or transmission devices.

Computer programs incorporating various features of the present invention may be encoded on various computer-readable storage media; suitable media include magnetic disk or tape, optical storage media such as compact disk (CD) or DVD (digital versatile disk), flash memory, and the like. Computer-readable storage media encoded with the program code may be packaged with a compatible device or provided separately from other devices. In addition program code may be encoded and transmitted via wired optical, and/or wireless networks conforming to a variety of protocols, including the Internet, thereby allowing distribution, e.g., via Internet download. Any such computer-readable storage medium may reside on or within a single computer product (e.g. a hard drive, a CD, or an entire computer system), and may be present on or within different computer products within a system or network. A computer system may include a monitor, printer, or other suitable display for providing any of the results mentioned herein to a user.

As described above, one aspect of the present technology is the gathering and use of data available from various sources to improve prediction of users that a user may be interested in communicating with. The present disclosure contemplates that in some instances, this gathered data may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to predict users that a user may want to communicate with at a certain time and place. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of people centric prediction services, the present technology can be configured to allow users to select to "opt in" or "opt out" of participation in the collection of personal information data during registration for services or anytime thereafter. In another example, users can select to not provide precise location information, but permit the transfer of location zone information. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, users that a user may want to communicate with at a certain time and place may be predicted based on non-personal information data or a bare minimum amount of personal information, such as the content being requested by the device associated with a user, other non-personal information, or publicly available information.

Although the invention has been described with respect to specific embodiments, it will be appreciated that the invention is intended to cover all modifications and equivalents within the scope of the following claims.

All patents, patent applications, publications, and descriptions mentioned herein are incorporated by reference in their entirety for all purposes. None is admitted to be prior art.

What is claimed is:

1. A computer-implemented method comprising:
receiving a first instance of code to be simulated for a first mobile device and a second instance of code to be simulated for a second mobile device;
generating, on a graphical user interface (GUI) on a display screen of a computer system, a first representation of the first mobile device and a second representation of the second mobile device;
receiving a ranging function call, the ranging function call requesting a ranging measurement between the first representation of the first mobile device and the second representation of the second mobile device;
determining a first pixel representative of a first location of the first representation and a second pixel representative of a second location of the second representation;
determining a separation value between the first pixel and the second pixel on the display screen;
determining a ranging value based on the separation value; and
providing the ranging value to the first instance of code as a response to the ranging function call, thereby enabling the first instance of code to use the ranging value for simulating a physical ranging measurement between two physical devices.

2. The method of claim 1, wherein determining the first pixel and the second pixel incudes:
creating a virtual coordinate system using a physical layout of the display screen, the virtual coordinate system including an origin;
determining a first center point of the first mobile device using a first size of the first mobile device, wherein the first pixel corresponds to the first center point in the virtual coordinate system; and
determining a second center point of the second mobile device using a second size of the second mobile device, wherein the second pixel corresponds to the second center point in the virtual coordinate system.

3. The method of claim 2, wherein determining the ranging value includes applying one or more scaling factors to the separation value to transform the ranging value to a physical coordinate system.

4. The method of claim 2, wherein the ranging value comprises a scaled separation value and direction angle values when the representation of the second mobile device is within a field of view of the representation of the first mobile device.

5. The method of claim 1, wherein determining the ranging value includes determining azimuth and elevation angles between the first representation and the second representation based on a mapping function of a two-dimensional plane to a three-dimensional sphere.

6. The method of claim 1, further comprising:
receiving a second ranging function call from the first instance of code;
determining a third pixel representative of a third location of the first representation and a fourth pixel representative of a fourth location of the second representation;
determining a second separation value between the third pixel and the fourth pixel on the display screen;
determining a second ranging value based on the second separation value; and
updating a physical distance and physical direction as relative positions of the first mobile device representation and the second mobile device representation are changed on the GUI.

7. The method of claim 1, wherein the ranging value is scaled to a separation value between physical mobile devices based on extents of the GUI on the display screen.

8. A non-transitory computer-readable storage medium having stored therein instructions which when executed by a processor cause the processor to perform operations comprising:
receiving a first instance of code to be simulated for a first mobile device and a second instance of code to be simulated for a second mobile device;
generating, on a graphical user interface (GUI) on a display screen of a computer system, a first representation of the first mobile device and a second representation of the second mobile device;
receiving a ranging function call, the ranging function call requesting a ranging measurement between the first representation of the first mobile device and the second representation of the second mobile device;
determining a first pixel representative of a first location of the first representation and a second pixel representative of a second location of the second representation;
determining a separation value between the first pixel and the second pixel on the display screen;
determining a ranging value based on the separation value; and
providing the ranging value to the first instance of code as a response to the ranging function call, thereby enabling the first instance of code to use the ranging value for simulating a physical ranging measurement between two physical devices.

9. The non-transitory computer-readable storage medium as defined in claim 7, further comprising instructions for causing the processor to perform operations comprising:
creating a virtual coordinate system using a physical layout of the display screen, the virtual coordinate system including an origin;
determining a first center point of the first mobile device using a first size of the first mobile device, wherein the first pixel corresponds to the first center point in the virtual coordinate system; and
determining a second center point of the second mobile device using a second size of the second mobile device, wherein the second pixel corresponds to the second center point in the virtual coordinate system.

10. The non-transitory computer-readable storage medium as defined in claim 8, further comprising instructions for causing the processor to perform operations comprising:
applying one or more scaling factors to the separation value to transform the ranging value to a physical coordinate system.

11. The non-transitory computer-readable storage medium as defined in claim 9, wherein the ranging value comprises a scaled separation value and direction angle values when the representation of the second mobile device is within a field of view of the representation of the first mobile device.

12. The non-transitory computer-readable storage medium as defined in claim 7, wherein determining the ranging value includes determining azimuth and elevation angles between the first representation and the second representation based on a mapping function of a two-dimensional plane to a three-dimensional sphere.

13. The non-transitory computer-readable storage medium as defined in claim 7, further comprising instructions for causing the processor to perform operations comprising:
receiving a second ranging function call from the first instance of code;
determining a third pixel representative of a third location of the first representation and a fourth pixel representative of a fourth location of the second representation;
determining a second separation value between the third pixel and the fourth pixel on the display screen;
determining a second ranging value based on the second separation value; and
updating a physical distance and physical direction as relative positions of the first mobile device representation and the second mobile device representation are changed on the GUI.

14. The non-transitory computer-readable storage medium as defined in claim 7, wherein the ranging value is scaled to a separation value between physical mobile devices based on extents of the GUI on the display screen.

15. A computer system comprising:
one or more processors; and
a computer-readable storage medium configured to store processor executable instructions that when executed cause the one or more processors to perform operations including:
receiving a first instance of code to be simulated for a first mobile device and a second instance of code to be simulated for a second mobile device;
generating, on a graphical user interface (GUI) on a display screen of a computer system, a first representation of the first mobile device and a second representation of the second mobile device;
receiving a ranging function call, the ranging function call requesting a ranging measurement between the first representation of the first mobile device and the second representation of the second mobile device;
determining a first pixel representative of a first location of the first representation and a second pixel representative of a second location of the second representation;
determining a separation value between the first pixel and the second pixel on the display screen;
determining a ranging value based on the separation value; and
providing the ranging value to the first instance of code as a response to the ranging function call, thereby enabling the first instance of code to use the ranging value for simulating a physical ranging measurement between two physical devices.

16. The computer system of claim 14, wherein the computer-readable storage medium is further configured to store processor executable instructions that when executed cause the one or more processors to perform operations including:
creating a virtual coordinate system using a physical layout of the display screen, the virtual coordinate system including an origin;
determining a first center point of the first mobile device using a first size of the first mobile device, wherein the first pixel corresponds to the first center point in the virtual coordinate system; and
determining a second center point of the second mobile device using a second size of the second mobile device, wherein the second pixel corresponds to the second center point in the virtual coordinate system.

17. The computer system of claim 15, wherein the computer-readable storage medium is further configured to store processor executable instructions that when executed cause the one or more processors to perform operations including:
applying one or more scaling factors to the separation value to transform the ranging value to a physical coordinate system.

18. The computer system of claim 16, wherein the ranging value comprises a scaled separation value and direction angle values when the representation of the second mobile device is within a field of view of the representation of the first mobile device.

19. The computer system of claim 14, wherein determining the ranging value includes determining azimuth and elevation angles between the first representation and the second representation based on a mapping function of a two-dimensional plane to a three-dimensional sphere.

20. The computer system of claim 14, wherein the computer-readable storage medium is further configured to store processor executable instructions that when executed cause the one or more processors to perform operations including:
receiving a second ranging function call from the first instance of code;
determining a third pixel representative of a third location of the first representation and a fourth pixel representative of a fourth location of the second representation;
determining a second separation value between the third pixel and the fourth pixel on the display screen;
determining a second ranging value based on the second separation value; and
updating a physical distance and physical direction as relative positions of the first mobile device representation and the second mobile device representation are changed on the GUI.

* * * * *